US007000205B2

(12) United States Patent
Devgan et al.

(10) Patent No.: US 7,000,205 B2
(45) Date of Patent: Feb. 14, 2006

(54) METHOD, APPARATUS, AND PROGRAM FOR BLOCK-BASED STATIC TIMING ANALYSIS WITH UNCERTAINTY

(75) Inventors: Anirudh Devgan, Austin, TX (US); Chandramouli V. Kashyap, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 10/448,240

(22) Filed: May 29, 2003

(65) Prior Publication Data

US 2004/0243954 A1 Dec. 2, 2004

(51) Int. Cl.
*G06F 17/50* (2006.01)

(52) U.S. Cl. .............................................. 716/6; 716/4

(58) Field of Classification Search ................ 716/4–6, 716/18; 703/19
See application file for complete search history.

(56) References Cited

U.S. PATENT DOCUMENTS

| 6,385,759 | B1 * | 5/2002 | Batarekh ........................ 716/6 |
| 6,557,151 | B1 * | 4/2003 | Donath et al. .................. 716/6 |
| 6,629,293 | B1 * | 9/2003 | Chang et al. ................... 716/4 |
| 6,718,529 | B1 * | 4/2004 | Iwanishi ........................ 716/6 |

* cited by examiner

Primary Examiner—Paul Dinh
(74) Attorney, Agent, or Firm—Duke W. Yee; Casimer K. Salys; Stephen R. Tkacs

(57) ABSTRACT

A block-based statistical timing analysis technique is provided in which the delay and arrival times in the circuit are modeled as random variables. The arrival times are modeled as Cumulative Probability Distribution Functions (CDFs) and the gate delays are modeled as Probability Density Functions (PDFs). This leads to efficient expressions for both max and addition operations, the two key functions in both regular and statistical timing analysis. Although the proposed approach can handle any form of the CDF, the CDFs may also be modeled as piecewise linear for computational efficiency. The dependency caused by reconvergent fanout is addressed, which is a necessary first step in a statistical STA framework. Reconvergent fanouts are efficiently handled by a common mode removal approach using statistical "subtraction."

20 Claims, 5 Drawing Sheets

METHOD, APPARATUS, AND PROGRAM FOR BLOCK-BASED STATIC TIMING ANALYSIS WITH UNCERTAINTY

BACKGROUND OF THE INVENTION

1. Technical Field

The present invention relates to static timing analysis and, in particular, to block-based static timing analysis with uncertainty.

2. Description of Related Art

Static timing analysis (STA) is critical to the measurement and optimization of the performance of a circuit before its manufacture. Full chip static timing analysis is usually performed using efficient block-based techniques. A block-based approach allows incremental, embedded static timing analysis and therefore enables timing-driven flows in logic synthesis and physical design. Hence, block-based static timing analysis has emerged as one of the key technologies in current design methodologies.

The timing or performance of the chip is heavily dependent on the manufacturing process variations (e.g. Vt, Length, etc.) and design environment variations (e.g. VDD and temperature variations, noise impact on timing, etc.). As the feature sizes decrease, the ability to control the manufacturing spread or accuracy of a given feature size also decreases. Along with increased process variations, the uncertainty caused by design also increases. The increase of uncertainty in design is caused by increase of power supply and temperature variations and interconnect loading uncertainty such as coupling noise impact on timing. Another source of uncertainty is the inherent error in the gate delay models, also called the model-to-hardware correlation error. It is critical that these increased timing uncertainties be handled in the design process in an efficient and accurate manner. Given the pervasive nature of static timing, it is essential that a variation-aware static timing approach be suitable for full chip designs.

Design variations or uncertainty in static timing analysis is typically handled in two broad ways. The first set of techniques handle variations by worst casing the circuit response. In such a scenario, static timing is performed at various design corners (e.g. fast, slow and nominal design corners). For example, the fast corner is computed by placing all of the gates (or transistors) at the fast corner and performing a regular deterministic timing analysis. The timing results of the fast, slow, and nominal corners can also be combined to minimize the typically large error of worst-case analysis.

This approach is computationally attractive but can be inaccurate due to its worst-case nature. The worst-case approach has traditionally been used for industrial designs but is becoming inapplicable as the timing variations continue to increase. Furthermore, to account for intra-chip or local variations, these techniques scale the data and clock path delays differently using empirical factors.

The second way to handle variations in timing is to perform statistical timing analysis. Statistical static timing analysis has been well-studied. Reconvergent fanouts have caused several statistical timing analysis approaches to have exponential complexity. Efficient approximate techniques for reconvergent fanout are not addressed in these techniques. Block-based approaches to statistical STA have been proposed.

In one such approach, the delays of the gates and arrival times are modeled as independent discrete random variables. Reconvergent fanouts are not considered. False path analysis using this basic framework is considered in another approach. Yet another approach proposes a technique which computes both upper and lower bounds to the exact solution, in the presence of reconvergent fanouts. Further, the prior art approaches to block-based statistical static timing analysis show that statistical STA performed without accounting for reconvergent fanouts is an upper bound on the actual delay. However, their methods of enumerating selected nodes to obtain improved bounds may be cumbersome for large circuits, and have exponential runtime in the worst case.

A further drawback of these block-based approaches is that they model both gate delays and arrival times as discrete probability density functions or PDFs. This involves propagating impulse trains across the circuit and taking the statistical maximum of two arrival times, a fundamental operation in STA, becomes inefficient.

In contrast to the above block-based methods, a path-based approach has been proposed. Each path delay is modeled as a sum of individual gate delays with each gate delay being a function of random variables. By assuming small deviations from the nominal value, a linear statistical model for gate delay is constructed that can be efficiently summed up to get the path delay. However, to get the circuit delay a statistical maximum is performed assuming independent paths which is not true in general.

Another drawback of path-based approaches is that a large number of paths must be examined and can be exponential in the worst-case. Furthermore, path-based approaches are not amenable to incremental STA, a necessary requirement in the synthesis and optimization of designs. Some prior art path-based approaches perform circuit optimization in the presence of uncertainties by considering the large number of equally critical paths. However, these approaches do not include any technique for performing statistical STA.

SUMMARY OF THE INVENTION

The present invention provides a block-based statistical timing analysis technique in which the delay and arrival times in the circuit are modeled as random variables. The arrival times are modeled as Cumulative Probability Distribution Functions (CDFs) and the gate delays are modeled as Probability Density Functions (PDFs). This leads to efficient expressions for both max and addition operations, the two key functions in both regular and statistical timing analysis. Although the proposed approach can handle any form of the CDF, preferably the CDFs are modeled as piecewise linear for computational efficiency.

The present invention addresses the dependency caused by reconvergent fanout, which is a necessary first step in a statistical STA framework. Reconvergent fanouts are efficiently handled by a common mode removal approach using the idea of a statistical "subtraction" as opposed to expensive path-tracing commonly used in the prior art.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
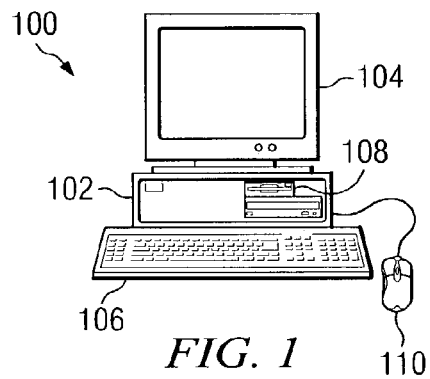
FIG. 1 is a pictorial representation of a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like.

Computer 100 can be implemented using any suitable computer, such as an IBM eServer workstation, which is a product of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

In accordance with a preferred embodiment of the present invention, a block-based statistical timing analysis technique is implemented on a computer, such as computer 100, in which the delay and arrival times in the circuit are modeled as random variables. The arrival times are modeled as Cumulative Probability Distribution Functions (CDFs) and the gate delays are modeled as Probability Density Functions (PDFs). This leads to efficient expressions for both max and addition operations, the two key functions in both regular and statistical timing analysis. Although the proposed approach can handle any form of the CDF, in this paper the CDFs are modeled as piecewise linear for computational efficiency.

The block-based statistical timing analysis technique of the present invention also addresses the dependency caused by reconvergent fanout, which is a necessary first step in a statistical STA framework. Reconvergent fanouts are efficiently handled by a common mode removal approach using the idea of a statistical "subtraction" as opposed to expensive path-tracing commonly used in the prior art.

Figure 2:
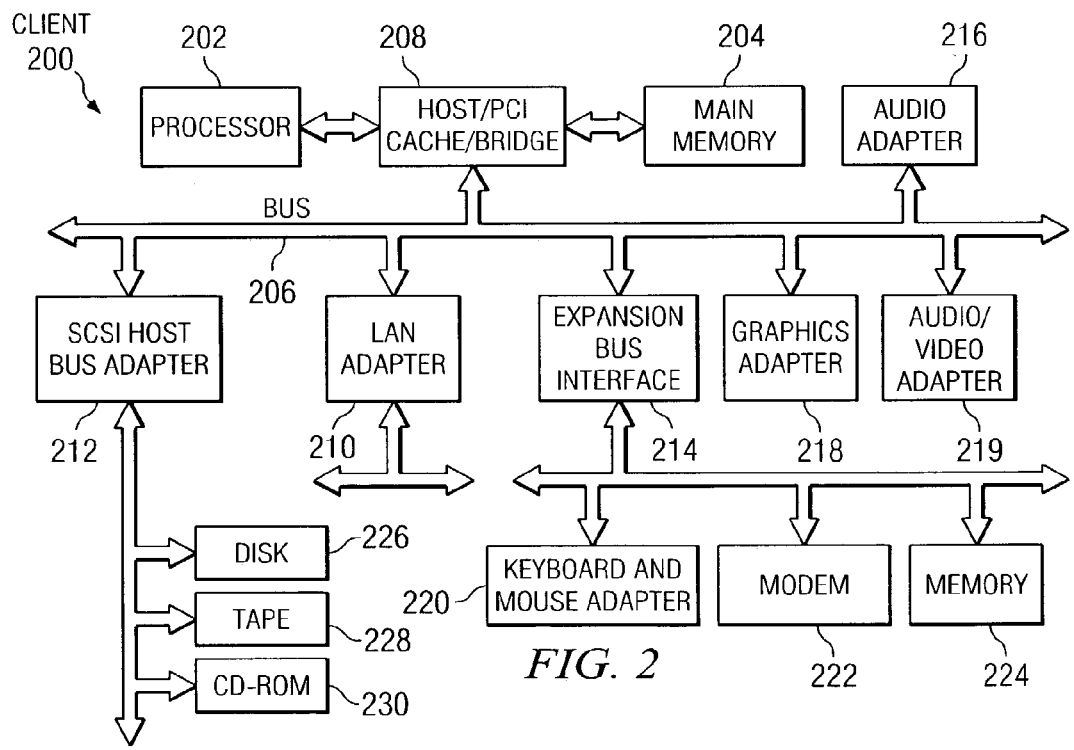
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards.

In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Advanced Interactive Executive (AIX) operating system. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

1. Statistical Timing Analysis

The problem in deterministic static timing analysis is to compute arrival times at the output nodes. Using these arrival times, the slack and, hence, the critical path of the circuit are determined. The arrival times at the input and the delay of the gates are specified as deterministic numbers.

In the case of statistical timing analysis, the arrival times and delays of the gates are specified as distributions. In general, the distribution of delays of the gates can take any form (i.e. normal, uniform, etc.). The problem in statistical timing analysis is to compute distribution of arrival times at the intermediate nodes and the output nodes. Given the required arrival time and distribution of output arrival times, critical paths and slack distributions can be computed for a given probability or confidence level.

Timing analysis is performed by levelizing the circuit. In other words, each intermediate node is a certain number of gates (levels) away from the input. The arrival time at the input is propagated through the gates at each level until it reaches the output. Propagating the arrival times through a gate is a key function in static timing.

Figure 3:
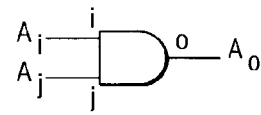
FIG. 3 is a diagram illustrating an example two-input gate in accordance with a preferred embodiment of the present invention.

FIG. 3 is a diagram illustrating an example two-input gate in accordance with a preferred embodiment of the present invention. In deterministic static timing analysis, arrival time $A_O$ at output node o is given by:

$$A_o = \max(A_i + D_{io}, A_j + D_{jo}) \quad (1)$$

Computation of max and addition is straightforward in regular timing analysis. In the present invention, arrival times are modeled as cumulative density functions (CDFs) and the delays are modeled as probability density functions (PDFs).

Figure 4A:
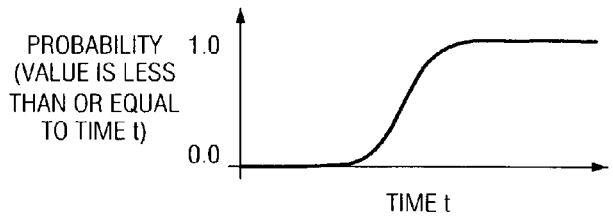
FIGS. 4A–4C illustrate the modeling of arrival times in accordance with a preferred embodiment of the present invention.
Figure 4B:
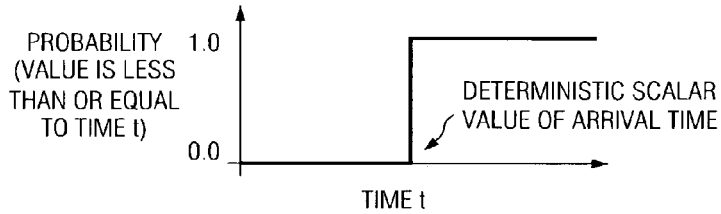
Figure 4C:
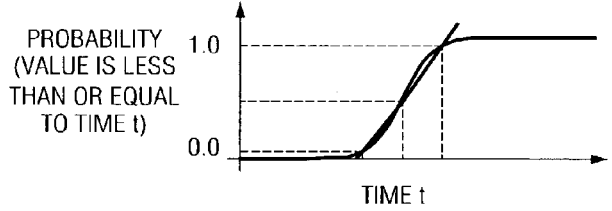

FIGS. 4A–4C illustrate the modeling of arrival times in accordance with a preferred embodiment of the present invention. More particularly, FIG. 4A illustrates the modeling of an arrival time as a cumulative density function. The first non-zero value of arrival time which has a non-zero cumulative probability is the lower bound on the arrival time. On the other hand, the value of arrival time where the cumulative probability reaches 1.0 is the upper bound on the arrival time. Arrival times in regular deterministic static timing can be viewed as a step function, as shown in FIG. 4B.

The cumulative density functions may also be modeled as piecewise linear. FIG. 4C shows an approximation of a cumulative density function with a three point piecewise linear function. The accuracy of the CDF modeling can be increased by increasing the number of points (or segments) in the piecewise linear model. The results are presented for three point, five point, and seven point piecewise linear model will be described in further detail below.

Piecewise linear modeling of CDFs lead to probability density functions (PDFs) being piecewise constant. The PDFs are not continuous, though their CDFs are continuous. The PDFs being non-continuous is not an issue, as long as CDFs of gate delays are continuous, CDFs of all the arrival times are also continuous.

Prior art techniques have used impulse train modeling for PDFs (or piecewise constant CDFs). The piecewise linear CDFs (or piecewise constant PDFs) used in the present invention are much more efficient representations of the distributions as compared to piecewise constant CDFs (or impulse train PDFs) as piecewise linear CDFs require a much lower number of segments for the same accuracy.

At any node i in the timing graph, $C_i(t)$ is defined as the notation for its CDF. For delay between node i and node j, $P_{ij}(t)$ is defined as the PDF and $C_{ij}(t)$ is defined as the CDF. From the definition of CDF and PDF, $P_{ij}(t)$ is the derivative of $C_{ij}(t)$. Using this notation, the max and addition operations are defined. For now, these expressions assume that the variables (arrival time, delays) are independent. Techniques to handle interdependence due to reconvergent fanouts will be described in further detail below.

Addition:

Let $D_{ij}$ be the delay between node and node i and node j. The arrival time at node j is defined as:

$$A_j = D_{ij} + A_i \quad (2)$$

The sum of two random numbers is convolution of their probability functions. The CDF of delay at node j ($A_j$ is given by the convolution of $C_i(t)$ (i.e. CDF of $A_i$) with $P_{ij}(t)$ (i.e. PDF of $A_i$), which is defined by:

$$C_j = \int_o^t Ci(t-\tau)P_{ij}(\tau)d\tau \quad (3)$$

Max:

Let $A_o$ be the max of arrival time at node a ($A_a$) and arrival time at node b ($A_b$). That is, $$A_o = \max(A_a, A_b) \quad (4)$$

The CDF at node o can simply be given by $$C_o(t) = C_a(t)C_b(t) \quad (5)$$

That is, the CDF of the maximum of two independent random variables is simply the product of the CDF of the two variables. This simple expression is only possible if the variables are modeled as CDFs. If the variables are modeled as PDFs the max is significantly more complicated. Let $$A_o = \max(A_a, A_b) \quad (6)$$

The CDF of $A_o$ is given by probability of $A_o \leq t$. If $A_a$ and $A_b$ are independent, the probability of both $A_a$ and $A_b$ being less than t can be computed by the multiplication of CDF of arrival time at node a ($C_a(t)$) with the CDF of arrival time at node b ($C_b(t)$), given equation (5).

Once the expression for max and addition have been defined, statistical timing can be performed just like regular timing. The difference is that when addition of arrival time $A_i$ is needed with delay $D_{io}$ a convolution of $C_i$ is performed with $P_{io}$ instead of an algebraic add. And when max of two variables is needed, their CDFs are multiplied to yield the resultant CDF. Hence, the fundamental static timing operation in equation (1) is modified as follows in the proposed statistical timing analysis:

$$A_o = \max(A_i + D_{io}, A_j + D_{jo}) \qquad (7)$$

$$C_o = (C_i \otimes P_{io})(C_j \otimes P_{jo}) \qquad (8)$$

Where Co is the CDF of arrival time at node o ($A_o$). ($C_i \otimes P_{io}$) is the convolution of the CDF of $A_i$ with the PDF of $D_{jo}$ and ($C_j \otimes P_{jo}$) is the convolution of the CDF of $A_j$ with the PDF of $D_{jo}$, as defined in Equation (3). ($C_i \otimes P_{io}$)($C_j \otimes P_{jo}$) denotes the multiplication of two resultant CDFs to get the max.

Statistical timing analysis can be added to a regular static timing engine by replacing the fundamental max and add operation in Equation (1) by the one in Equation (8). Circuit parsing and setup, timing graph construction, graph traversal and incremental capabilities of regular timing can be used as is in statistical timing analysis. Techniques described in this section can be used for any model or form (i.e. normal, uniform, measured, etc.) of the variations (or the CDF).

1.1 Max and Addition with PWL Modeling

Figure 5A:
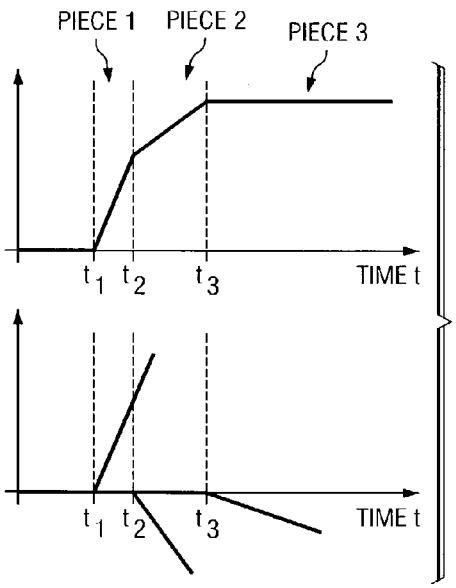
FIGS. 5A and 5B illustrate an example 3-piece CDF and an example 4-piece PDF decomposed in accordance with a preferred embodiment of the present invention.
Figure 5B:
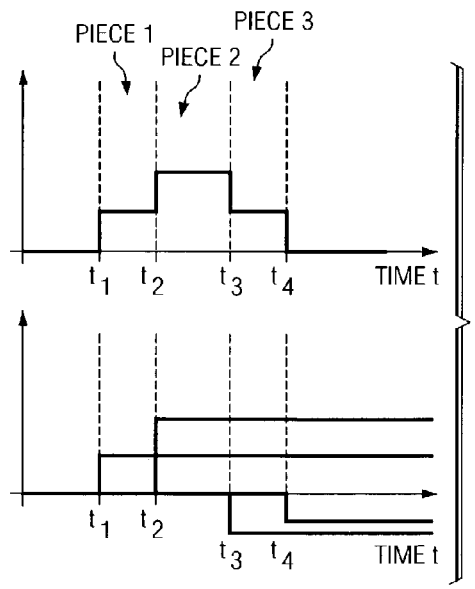

As mentioned previously, convolution is performed to add the input arrival time, which is modeled as a piecewise linear CDF, and the gate delay, which is modeled as a piecewise constant PDF. The CDF may be broken into a sum of ramps and the PDF may be broken into a sum of step signals. For instance, a 3-piece CDF and a 4-piece PDF are decomposed as shown in FIGS. 5A and 5B.

Figure 6:
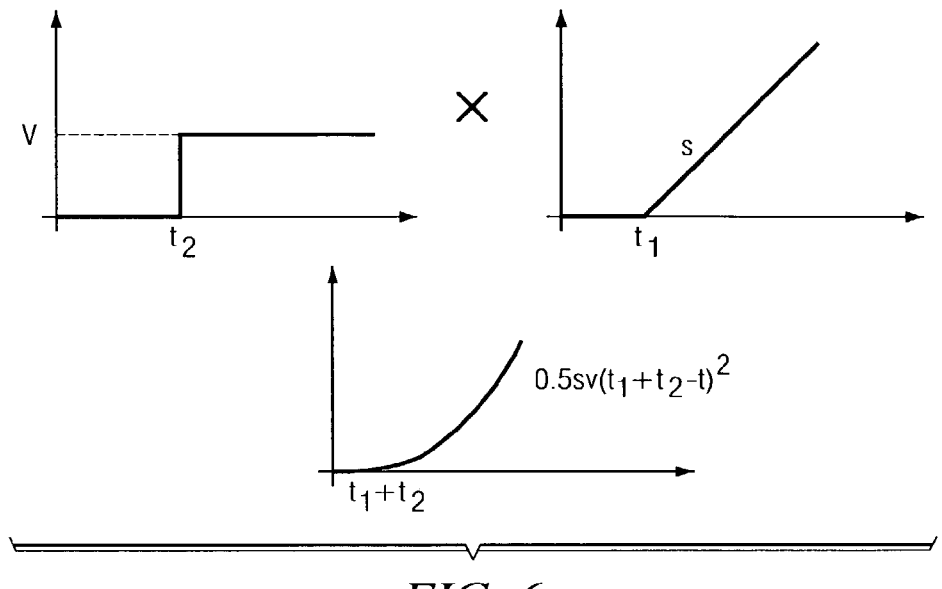
FIG. 6 illustrates a ramp and a step waveform being individually convolved in accordance with a preferred embodiment of the present invention.

Each ramp and each step waveform is convolved individually as shown in FIG. 6. Here s is the slope of the ramp. The resultant waveform is a quadratic. For an n-piece CDF and an n-piece PDF, a total of $n^2$ convolutions are performed. The $n^2$ quadratics are then summed together to obtain the resultant CDF. Finally, for forward propagation the quadratic CDF is converted back to a piecewise linear CDF by sampling at the preset probability values. No nonlinear iterations are required for the sampling since closed-form formulas for the crossing times can be obtained since the result of convolution is a quadratic.

Figure 7:
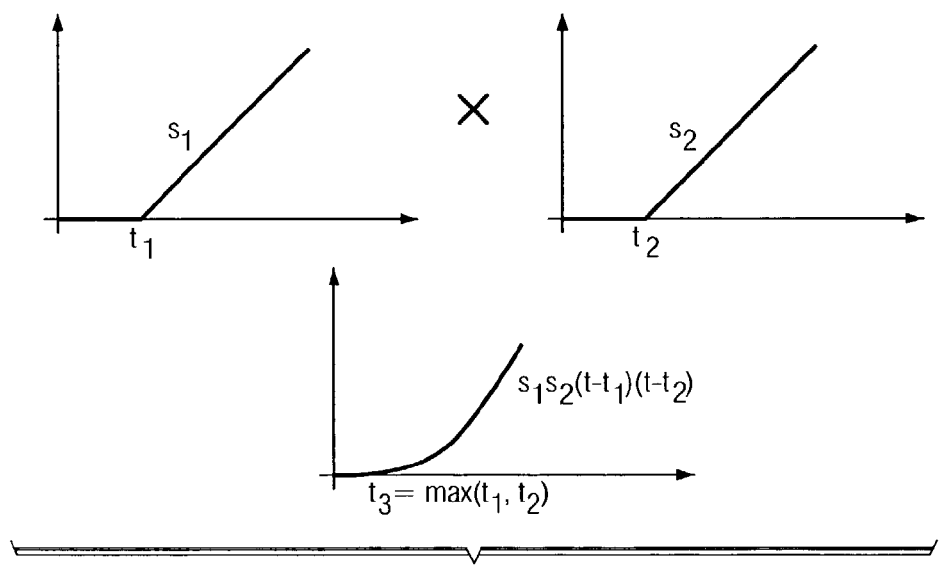
FIG. 7 illustrates a ramp of a first example CDF being multiplied by a ramp of a second example CDF in accordance with a preferred embodiment of the present invention.

The multiplication of two piecewise linear CDFs similar to the convolution shown above. The piecewise linear CDF is decomposed as a sum of ramps as shown in FIG. 5A. Each ramp of the first CDF is multiplied by each ramp of the second CDF as shown in FIG. 7. The resultant waveform is again a quadratic. For n pieces in each of the two CDFs, $n^2$ quadratic pieces are produced due to multiplication. These are then summed up to get the resultant CDF. As before, the CDF is sampled at the preset probability values to get the piecewise linear CDF for forward propagation.

Figure 8:
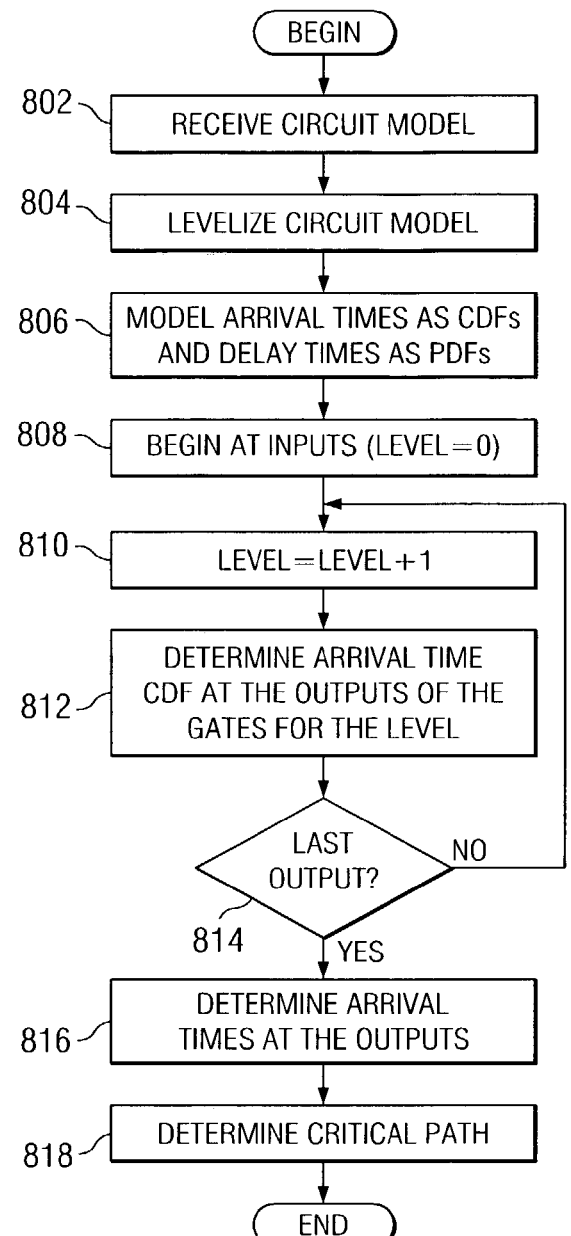
FIG. 8 is a flowchart illustrating the operation of a block-based static timing analysis method in accordance with a preferred embodiment of the present invention.

With reference to FIG. 8, a flowchart illustrating the operation of a block-based static timing analysis method is shown in accordance with a preferred embodiment of the present invention. The process begins and receives a circuit model (step 802). The process then levelizes the circuit model (step 804) and models arrival times in the circuit model as CDFs and delay times in the circuit model as PDFs (step 806). Next, the process begins at the inputs (level=0) (step 808) and examines the next level (level=level+1) (step 810).

The process determines the arrival time CDF at the outputs of the gates for the level using the techniques described herein (step 812). A determination is made as to whether the level includes the last output (output of the highest level) in the circuit model (step 814). If the level does not include the last output, the process returns to step 810 to examine the next level. If the level does include the last output in step 814, the process determines the arrival times at the outputs (step 816) and determines a critical path for the circuit model based upon the propagated arrival times CDFs (step 818). Thereafter, the process ends.

1.2 Time Complexity of the Proposed Method

Block-based deterministic timing analysis can be performed in O(E+V) where E and V are the number of edges and vertices in the timing graph respectively. In the statistical case, convolution is performed for each edge in the timing graph and the multiplication is performed at each vertex for all the incident edges in the timing graph. Since each of these operations takes $O(n^2)$ time for an n-piece CDF/PDF model, the overall complexity of the approach of the present invention is $O(n^2 E + V)$.

2. Handling Reconvergent Fanouts

Figure 9:
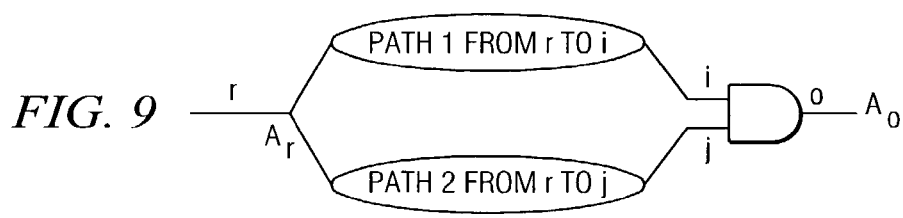
FIGS. 9 and 10 depict example circuits including reconvergent fanouts in accordance with a preferred embodiment of the present invention.

The complexity of statistical timing analysis usually increases due to reconvergent fanouts. The present invention provides a technique to capture reconvergent fanouts in the proposed statistical timing framework. FIG. 9 depicts an example circuit including reconvergent fanouts in accordance with a preferred embodiment of the present invention. In this example, two paths originating from node r reconverge as inputs to the same gate at nodes i and j. This causes both the arrival times $A_i$ and $A_j$ to depend on arrival time $A_r$. This dependency potentially complicates the computation of arrival time $A_o$ since equation (5) can no longer be used.

It should be noted that the interdependence of arrival time and has a very specific linear form. The arrival times are as follows:

$$A_i = A_r + D_1 \qquad (9)$$

$$A_j = A_r + D_2 \qquad (10)$$

The variable of interest, arrival time at node o, $A_o$, is given by $$A_o = \max(A_r + D_1 + D_{io}, A_r + D_2 + D_{jo}) \qquad (11)$$

The computation in Equation (11) can be exactly rewritten as follows:

$$A_o = A_r + \max(D_1 + D_{io}, D_2 + D_{jo}) \qquad (12)$$

The expression is simplified by taking out the common mode $A_r$. Since $D_1$, $D_2$, $D_{io}$, and $D_{jo}$, are independent, the expression derived in Section 1 can be used. In other words, the CDF at node o can simply be rewritten as follows:

$$C_o = C_r \otimes [(C_1 \otimes D_{io})(C_2 \otimes D_{jo})]' \qquad (13)$$

where $C_r$ is the CDF of arrival time at node r, $C_1$ is the CDF of delay $D_1$, $C_2$ is the CDF of delay $D_2$, and $\otimes$ is the convolution operator defined in Equation (3). Note that the expression within the square bracket is a CDF. Therefore, the dash at the end denotes the derivative (which yields the PDF) of the expression within the square brackets. This is required so that convolution with $C_r$ produces the right CDF.

To compute $A_o$, the computation of $D_1$ and $D_2$ is required. One way is to perform path tracing to get these values. However, it is simpler and more desirable to compute $D_1$ and $D_2$ through statistical subtraction. Hence, $D_1$ and $D_2$ are determined as follows:

$$D_1 = A_i - A_r \qquad (14)$$

$$D_2 = A_j - A_r \qquad (15)$$

The statistical subtraction is equivalent to the inverse of convolution, and one way to do this is by moment matching. Consider the following case:

$$A_z = A_x - A_y \quad (16)$$

where $A_x$ and $A_y$ are known and $A_z$ is the unknown. This can be rewritten as follows:

$$C_x = C_z \otimes P_y \quad (17)$$

$$P_x = P_z \otimes P_y \quad (18)$$

Since z and y are independent, their mean and variances will add in a convolution. That is, $$\mu_x = \mu_z + \mu_y \quad (19)$$

$$\sigma_x^2 = \sigma_z^2 + \sigma_y^2 \quad (20)$$

Since $P_x$, $C_x$, $P_y$ and $C_y$ are known, their mean and variances can be computed from their PDFs (or their piecewise linear CDF). Hence, the required mean and variance of $C_z$ can be computed from algebraic subtraction, or $$\mu_z = \mu_x - \mu_y \quad (21)$$

$$\sigma_z^2 = \sigma_x^2 - \sigma_y^2 \quad (22)$$

Once the mean $\mu_z$ and variance $\sigma_z^2$ are computed, the CDF, $C_z$, can be determined by fitting the mean and variance to a probability distribution. Two moments (mean and variance) are matched to determine the distribution. This method can also be extended by matching higher order moments and performing Pade approximation to determine the CDF.

In general, an input of a gate may depend on more than one previous node. For example, in FIG. 10, the inputs of the gate 5 depend on nodes A, B, C, and D. Some of these vertices may also share subpaths when reaching the inputs of gate 5. Therefore, when computing the arrival time at the output of gate 5, this dependency must be accounted for. To accomplish this, a dependency list (DL) with each vertex in the timing graph is maintained. The DL lists the vertices on which the arrival time of the current vertex depends. The vertices are sorted by the level in a descending order. In other words, the most recent vertex (i.e. the one with the highest level) appears first and so on. The DL is propagated to compute the statistical arrival times using the DLPropagate algorithm shown below.

In the algorithm $DL_i$ denotes the DL of the ith input and $Dl_o$ denotes the DL of the output node. If an input does not contribute to the output of the gate (for example, it may be 1 well before any other input arrives), its DL is not propagated to the output. In addition, the present invention uses two other pruning heuristics to limit the size of the DL. The present invention allows the user to specify the size of the list. In addition, the method of the present invention only carries forward the n most recent (i.e. level) vertices where n is again set by the user. Thus, all the prior vertices that impact the arrival time of a given vertex are known without any path tracing.

```
Algorithm DL Propagate
    DL_o = NULL
    if gate output has fanout >1
        add output node to DL_o
    for each input i if gate contributing to output
        for each node v in DL_i and not in Dl_o
            add v in DL_o using insertion sort
            in descending order by level
    return DL_o
```

Next, the present invention computes the arrival time at the output of a multi-input gate, with each input possibly having a non-empty dependency list. An approximate algorithm is shown below. The key idea is to reduce the dependency of each input to a single vertex so that equation (13) may be applied. In the algorithm, $A_o$ is the output arrival time, $A_i$ is the arrival time at the ith input and $A_v$ is the arrival time at vertex v.

```
Algorithm depMax
    A_o = -∞
    L = NULL
    for each input I
        for each vertex v in DL_i
            if (v covers more than one input)
                && (v does not appear in L)
                    insert v according to level in L
                    mark inputs that v covers
    if (L is empty)
        proceed as in independent case
    else
        for each v in L
        {
            A_ov = -∞
            for each input i that it covers
                A_ov = max(A_ov, A_i - A_v + D_io)
            A_o = max(A_o, A_ov)
        }
    return A_o
```

Once a dependent max is computed at the output of a gate, the dependency lists of the inputs are not propagated forward.

Figure 10:
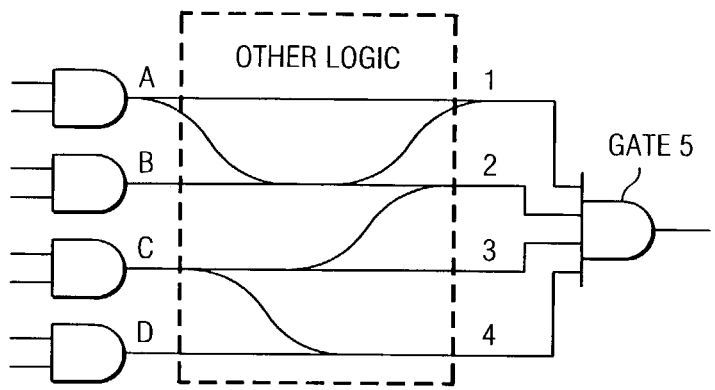

For example, referring to FIG. 10, the output of gate 5 depends on A, B, and C. However, depMax will identify that inputs 1 and 2 depend on B (since B is at a higher level than A) and that inputs 3 and 4 depend on C. Thus the arrival times due to 1 and 2 (as well as 3 and 4) will be computed using (13) and the two resultant arrival times will be treated as independent and combined using (5) to get the output arrival time. The dependency lists of the inputs to gate 5 will not be carried forward.

3. Results

The block-based static timing analysis approach of the present invention has been implemented and its results are presented for various International Symposium on Circuits and Systems (ISCAS) benchmark circuits. The ISCAS circuit have been mapped using a commercial logic synthesis system to a recent library consisting of gates with maximum of four fanins. The cell library consists of the following gates: inverter, 2-input NAND, 2-input NOR, 2-input AND, 2-input OR, and 4-input NAND, 4-input NOR, 4-input AND, 4-input OR cell. The circuits and their numbers of gates, as well as their inputs and outputs, are shown in Table 1 below. The variations of the individual gate delays can be modeled as any distribution. The results in this section use normal distribution for the modeling of the variations in the proposed method and the Monte Carlo method.

TABLE 1

| Ciruit | Gates | Inputs | Outputs |
|---|---|---|---|
| C432 | 125 | 45 | 8 |
| C499 | 544 | 75 | 33 |
| C880 | 365 | 88 | 27 |
| C1908 | 495 | 60 | 26 |
| C2670 | 657 | 299 | 65 |

TABLE 1-continued

| Ciruit | Gates | Inputs | Outputs |
|---|---|---|---|
| C3540 | 1120 | 74 | 23 |
| C6288 | 2727 | 66 | 33 |
| C7552 | 2608 | 316 | 108 |

Table 2 compares the accuracy of the proposed statistical timing method. The comparisons are made against golden Monte Carlo method (each with 10,000 timing runs). The results of worst case method are also shown. The worst case method uses a regular deterministic timing analysis with the delay of each gate set to 3σ from the mean value. The 99% confidence point of the CDF is shown for the Monte Carlo and the proposed method. As seen from the table, the worst case method can be 21–24% off from the desired Monte Carlo method. The proposed method produces very accurate results as compared to Monte Carlo method with error of only 0.3% to 0.79%. The results shown are with a 7-point piecewise linear CDF modeling with no reconvergent fanout correction.

TABLE 2

| Circuit | Monte Carlo Method Delay (ps) | Worst Case Method Delay (ps) | Worst Case Method Error (%) | Proposed Method 99% Delay (ps) | Proposed Method 99% Error (%) |
|---|---|---|---|---|---|
| C432 | 3588 | 4426 | 23.3% | 3610 | 0.61% |
| C499 | 3505 | 4283 | 22.1% | 3525 | 0.57% |
| C880 | 3344 | 4088 | 22.2% | 3359 | 0.44% |
| C1908 | 3574 | 4355 | 21.8% | 3587 | 0.27% |
| C2670 | 2549 | 3094 | 21.3% | 2557 | 0.31% |
| C3540 | 5251 | 6500 | 23.4% | 5280 | 0.55% |
| C6288 | 20704 | 26351 | 27.2% | 20868 | 0.79% |
| C7552 | 5262 | 6565 | 24.4% | 5299 | 0.69% |

The Monte Carlo method takes into account reconvergent fanout. Statistical timing analysis that ignores reconvergent fanouts produces an upper bound on the true delay. However, the table also indicates that a statistical timing analysis without reconvergence fanout correction is very close to the real answer. Therefore, reconvergence does not cause a significant difference in overall answer for these circuits. The accuracy of the method of the present invention is further illustrated in Table 3. This table shows the results obtained by Monte Carlo and the proposed method for the 1% point in the CDF. The error compared to exact Monte Carlo is small and varies from 0.09% to 2.42%.

TABLE 3

| Circuit | Monte Carlo Method 1% pt. Delay (ps) | Proposed Method 1% CDF point Delay (ps) | Error (%) |
|---|---|---|---|
| C432 | 3285 | 3327 | 0.12% |
| C499 | 3250 | 3278 | 0.86% |
| C880 | 3057 | 3108 | 1.66% |
| C1908 | 3323 | 3403 | 24% |
| C2670 | 2287 | 2289 | 0.09% |
| C3540 | 4899 | 4967 | 1.38% |
| C6288 | 20008 | 20326 | 1.58% |
| C7552 | 4876 | 4997 | 2.42% |

The proposed method can be run with different modeling complexity of the piecewise linear (PWL) CDF. All of the CDFs in each circuit are modeled as a 3-point PWL model, a 5-point PWL model, and a 7-point PWL model. Accuracy comparisons of these three modeling levels is shown in Table 4. As expected, the accuracy of the technique of the present invention decreases with reduction in number of segment in the PWL approximation. However, even the 3-point PWL model provides a high degree of accuracy.

TABLE 4

| Circuit | 7-pt. PWL CDF Error (%) | 5-pt. PWL CDF Error (%) | 3-pt. PWL CDF Error (%) |
|---|---|---|---|
| C432 | 0.61% | 1.8% | −2.2% |
| C499 | 0.57% | 1.76% | −2.4% |
| C880 | 0.44% | 1.7% | −2.54% |
| C1908 | 0.27% | 1.65% | −2.63% |
| C2670 | 0.31% | 1.6% | −2.74% |
| C3540 | 0.55% | 1.81% | −2.15% |
| C6288 | 0.79% | 1.69% | −1.38% |
| C7552 | 0.69% | 1.84% | −1.98% |

The computational cost of different CDF PWL models is illustrated in Table 5. Performance is shown as the ratio to the 3-point PWL statistical timing run. For example, in circuit C880, the 5-point PWL model takes 2.5 times longer to run as compared to the 3-point PWL model and the 7-point PWL model takes 4.5 times longer to run as compared to the 3-point PWL model.

TABLE 5

| | Performance Impact of Variable Accuracy | |
|---|---|---|
| Circuit | 5-pt. PWL CDF | 7-pt. PWL CDF |
| C432 | 2.0 | 4.0 |
| C499 | 2.7 | 4.7 |
| C880 | 2.5 | 4.5 |
| C1908 | 3.3 | 5.3 |
| C2670 | 2.5 | 4.2 |
| C3540 | 2.1 | 3.7 |
| C6288 | 2.5 | 4.6 |
| C7552 | 2.7 | 4.7 |

Figure 11:
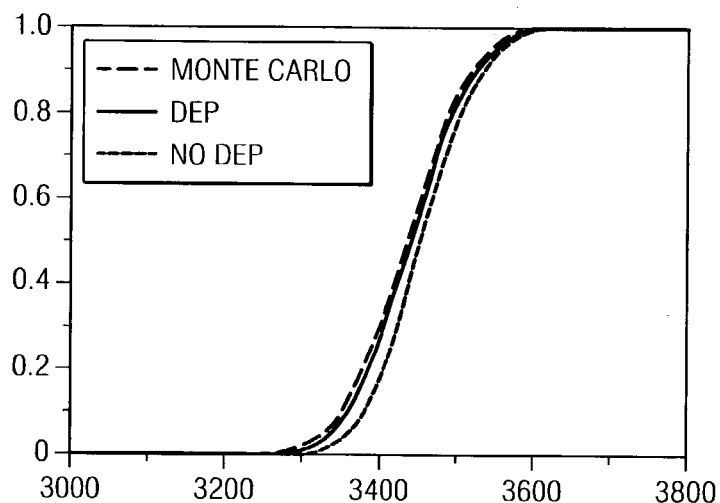
FIGS. 11 and 12 are graphs showing the accuracy of statistical timing with and without reconvergence fanout handling in accordance with a preferred embodiment of the present invention.
Figure 12:
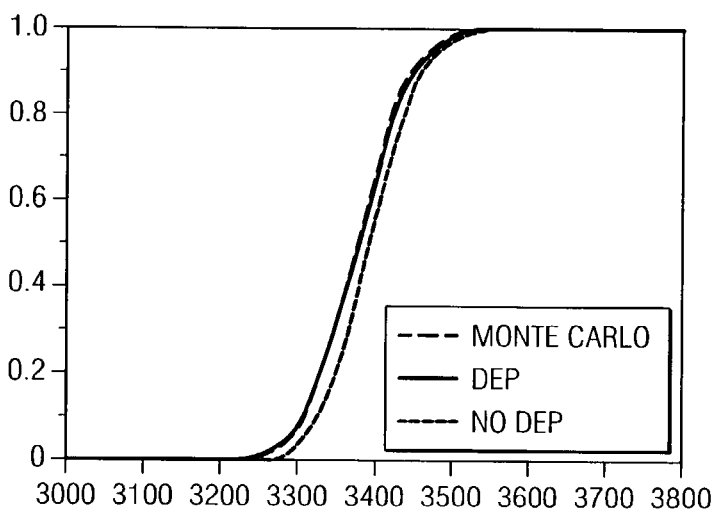

Accuracy of statistical timing with and without reconvergence fanout handling is shown in FIG. 11 and FIG. 12. More particularly, FIG. 11 shows the CDF of the arrival time of the most critical output for example circuit C432 as computed by Monte Carlo, proposed method without reconvergence (no dep), and proposed method with reconvergence (dep). FIG. 12 shows the CDF of the arrival time of the most critical output for example circuit C499 as computed by Monte Carlo, proposed method without reconvergence (no dep), and proposed method with reconvergence (dep). The proposed method with reconvergence handling compares very well to Monte Carlo validating the dominant common mode algorithm of Section 2. Performance impact of reconvergence handling in the proposed method is shown in Table 6. This table shows the percentage runtime overhead with reconvergence handling as compared to run time without reconvergence. The efficient nature of reconvergent handling procedure yields only about 10–30% penalty over timing without reconvergence handling.

TABLE 6

| Circuit | Performance Impact of Handling Reconvergence |
|---|---|
| C432 | 10% |
| C499 | 21% |
| C880 | 33% |
| C1908 | 19% |
| C2670 | 18% |
| C3540 | 30% |
| C6288 | 16% |
| C7552 | 24% |

4. Conclusion

The present invention solves the disadvantages of the prior art by providing a block-based static timing technique with uncertainty. This technique models the arrival times as cumulative distribution functions (CDFs) and gate delays as probability density functions (PDFs) for efficient timing analysis. Simple expressions are presented for the key operations: add and max. While the approach of the present invention works for any type of distribution, for efficiency the CDFs are modeled as piecewise linear distributions. An efficient technique based on statistical subtraction has been presented for handling reconvergent fanouts. The accuracy of the analysis can be varied by varying the accuracy of the piecewise linear CDF model. Regular (or deterministic) timing analysis can be easily incorporated into this statistical framework by modeling the CDF as a step. All of the expressions for statistical timing analysis are valid in the limiting case for deterministic timing analysis.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for block-based static timing analysis, the method comprising:

receiving a circuit model, wherein the circuit model has at least one input, a plurality of intermediate nodes, and at least one output;

modeling arrival times in the circuit model as cumulative distribution functions;

modeling delays in the circuit model as probability distribution functions; and propagating arrival times statistically from the at least one input to the at least one output.

2. The method of claim 1, wherein the step of propagating arrival times includes propagating an arrival time from an input of a gate to an output of the gate, wherein the input has an arrival time and the gate has a delay.

3. The method of claim 2, wherein the step of propagating an arrival time from the input of the gate to the output of the gate includes convolving a cumulative distribution function for the arrival time at the input of the gate with a probability distribution function for the delay of the gate.

4. The method of claim 1, wherein the step of propagating arrival times includes propagating arrival times from a first input and a second input of a gate to an output of the gate, wherein the first input has a first arrival time, the second input has a second arrival time, and the gate has a first delay from the first input to the output of the gate and a second delay from the second input to the output of the gate.

5. The method of claim 4, wherein the step of propagating arrival times from the first input and the second input of the gate to the output of the gate includes:

convolving a cumulative distribution function for the first arrival time with a probability distribution function for the first delay to form a first output arrival time;

convolving a cumulative distribution function for the second arrival time with a probability distribution function for the second delay to form a second output arrival time; and multiplying the first arrival time and the second output arrival time to form a max arrival time.

6. The method of claim 1, wherein each cumulative distribution function is a piecewise linear cumulative distribution function.

7. The method of claim 6, wherein each piecewise linear cumulative distribution function is one of a three-piece cumulative distribution function, a five-piece cumulative distribution function, and a seven-piece cumulative distribution function.

8. The method of claim 1, wherein each probability distribution function is a piecewise linear probability distribution function.

9. The method of claim 8, wherein each piecewise linear probability distribution function is one of a three-piece probability distribution function, a five-piece probability distribution function, and a seven-piece probability distribution function.

10. The method of claim 1, further comprising:

determining a critical path for the circuit model based upon the propagated arrival times.

11. A computer program product, in a computer readable medium, for block-based static timing analysis, the computer program product comprising:

instructions for receiving a circuit model, wherein the circuit model has at least one input, a plurality of intermediate nodes, and at least one output;

instructions for modeling arrival times in the circuit model as cumulative distribution functions;

instructions for modeling delays in the circuit model as probability distribution functions; and instructions for propagating arrival times statistically from the at least one input to the at least one output.

12. The computer program product of claim 11, wherein the instructions for propagating arrival times include instructions for propagating an arrival time from an input of a gate to an output of the gate, wherein the input has an arrival time and the gate has a delay,
  wherein the instructions for propagating an arrival time from the input of the gate to the output of the gate include instructions for convolving a cumulative distribution function for the arrival time at the input of the gate with a probability distribution function for the delay of the gate.

13. The computer program product of claim 11, wherein the instructions for propagating arrival times include instructions for propagating arrival times from a first input and a second input of a gate to an output of the gate, wherein the first input has a first arrival time, the second input has a second arrival time, and the gate has a first delay from the first input to the output of the gate and a second delay from the second input to the output of the gate.

14. The computer program product of claim 13, wherein the instructions for propagating arrival times from the first input and the second input of the gate to the output of the gate include:
  instructions for convolving a cumulative distribution function for the first arrival time with a probability distribution function for the first delay to form a first output arrival time;
  instructions for convolving a cumulative distribution function for the second arrival time with a probability distribution function for the second delay to form a second output arrival time; and
  instructions for multiplying the first arrival time and the second output arrival time to form a max arrival time.

15. The computer program product of claim 11, wherein each cumulative distribution function is a piecewise linear cumulative distribution function.

16. The computer program product of claim 15, wherein each piecewise linear cumulative distribution function is one of a three-piece cumulative distribution function, a five-piece cumulative distribution function, and a seven-piece cumulative distribution function.

17. The computer program product of claim 11, wherein each probability distribution function is a piecewise linear probability distribution function.

18. The computer program product of claim 17, wherein each piecewise linear probability distribution function is one of a three-piece probability distribution function, a five-piece probability distribution function, and a seven-piece probability distribution function.

19. The computer program product of claim 11, further comprising:
  instructions for determining a critical path for the circuit model based upon the propagated arrival times.

20. An apparatus for block-based static timing analysis, the apparatus comprising:
  means for receiving a circuit model, wherein the circuit model has at least one input, a plurality of intermediate nodes, and at least one output;
  means for modeling arrival times in the circuit model as cumulative distribution functions;
  means for modeling delays in the circuit model as probability distribution functions; and
  means for propagating arrival times statistically from the at least one input to the at least one output.

* * * * *